United States Patent [19]

Risko

[11] Patent Number: 5,386,084
[45] Date of Patent: Jan. 31, 1995

[54] ELECTRONIC DEVICE ENCLOSURE

[75] Inventor: John J. Risko, Stayton, Oreg.

[73] Assignee: II Morrow Inc., Salem, Oreg.

[21] Appl. No.: 96,605

[22] Filed: Jul. 22, 1993

[51] Int. Cl.6 ............................................... H05K 5/06
[52] U.S. Cl. .................. 174/52.3; 200/302.2; 277/184; 455/90
[58] Field of Search ............... 277/183, 184; 200/333, 200/302.2, 512; 174/52.3; 455/90, 347, 350, 351

[56] References Cited

U.S. PATENT DOCUMENTS

| | | | |
|---|---|---|---|
| 4,225,970 | 9/1980 | Jaramillo et al. | 455/89 |
| 4,352,968 | 10/1982 | Pounds | 200/302 |
| 4,421,966 | 12/1983 | Pounds | 200/309 |
| 4,456,797 | 6/1984 | Olsen | 381/88 |
| 4,506,563 | 3/1985 | Johnson | 74/867 |
| 4,546,986 | 10/1985 | Roselli | 277/184 |
| 4,584,718 | 4/1986 | Fuller | 455/351 |
| 4,658,116 | 4/1987 | Tsang et al. | 219/370 |
| 4,719,322 | 1/1988 | Guzik et al. | 455/89 X |
| 4,768,230 | 8/1988 | Viebrantz et al. | 455/603 |
| 5,025,921 | 6/1991 | Gasparaitis et al. | 455/351 X |
| 5,081,329 | 1/1992 | Mitusinski et al. | 200/314 |
| 5,089,671 | 2/1992 | Ranetkins | 200/5 A |
| 5,175,873 | 12/1992 | Goldenberg et al. | 455/89 X |
| 5,199,721 | 4/1993 | Schmitt | 277/181 |
| 5,219,067 | 6/1993 | Lima et al. | 200/302.2 |
| 5,270,507 | 12/1993 | Nakamura et al. | 200/511 |
| 5,288,119 | 2/1994 | Crawford, Jr. et al. | 294/65.5 |

Primary Examiner—Leo P. Picard
Assistant Examiner—Christopher Horgan
Attorney, Agent, or Firm—William A. Birdwell & Associates

[57] ABSTRACT

An electronic device enclosure is provided having a top and a bottom, preferably each made of a polycarbonate plastic material and having respective lower and upper edges which are the same shape, and an elastomeric cover which fits over the top and wraps around the lower edge thereof so as to seal the joint between the top and the bottom. Preferably, the cover is made of silicone rubber or urethane of a durometer in the range of 40 to 60. Push buttons with associated suspensions are moulded integrally into the cover so as to protrude downwardly through apertures in the top and engage push button switches on the electronic device therein. A display aperture may be provided in the top and, if so, a portion of the cover also wraps around the edges of the display aperture so as to be disposed between the display and the cover. A battery access door is provided which comprises a central, relatively ridged material surrounded by an elastomeric material which seals the joint between the battery access door and an aperture in the enclosure and which also provides a holder for the batteries.

18 Claims, 3 Drawing Sheets

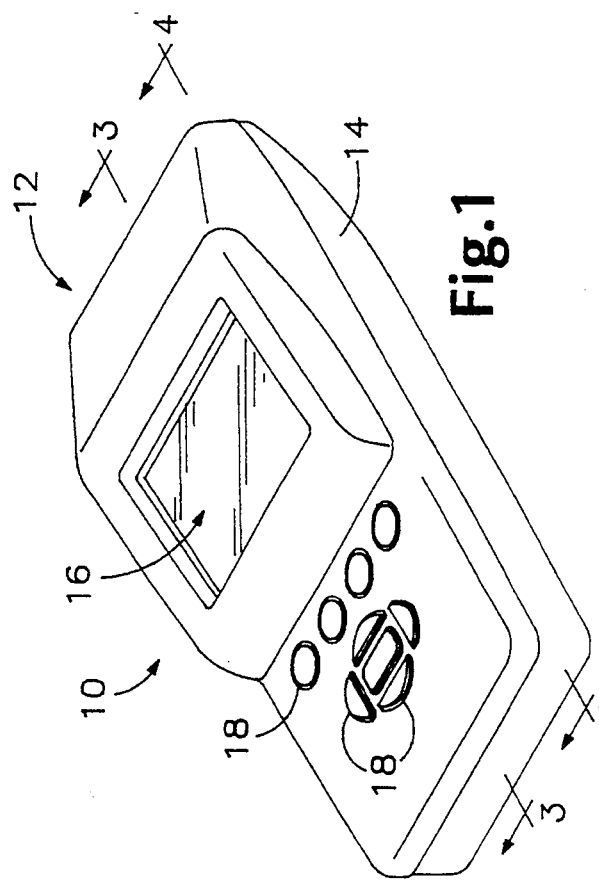
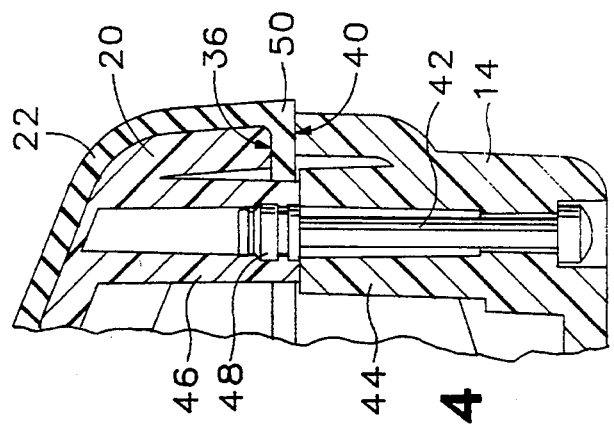
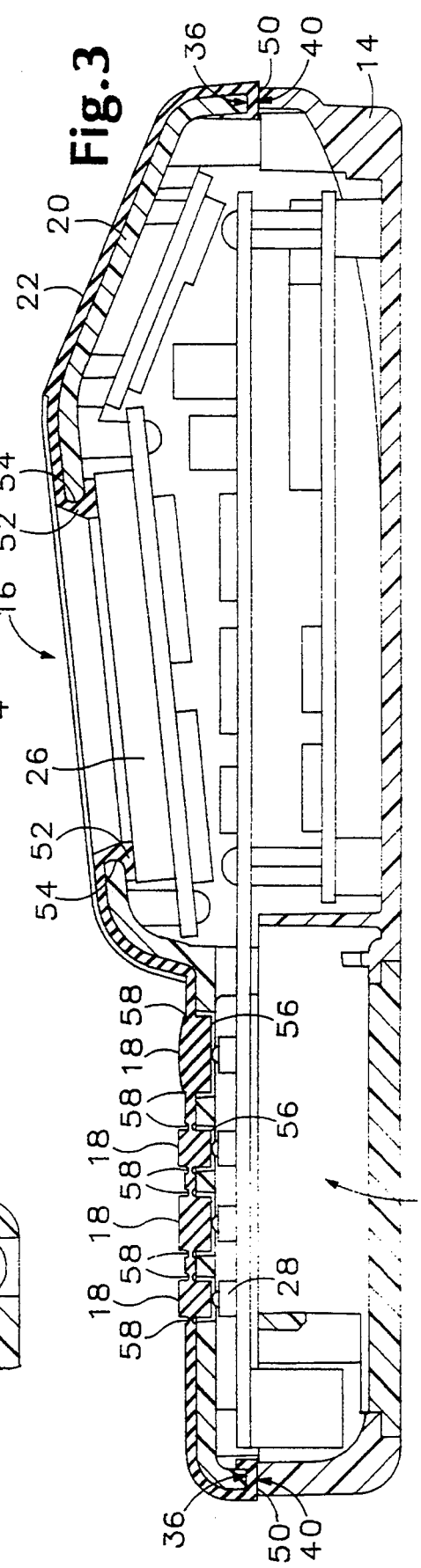

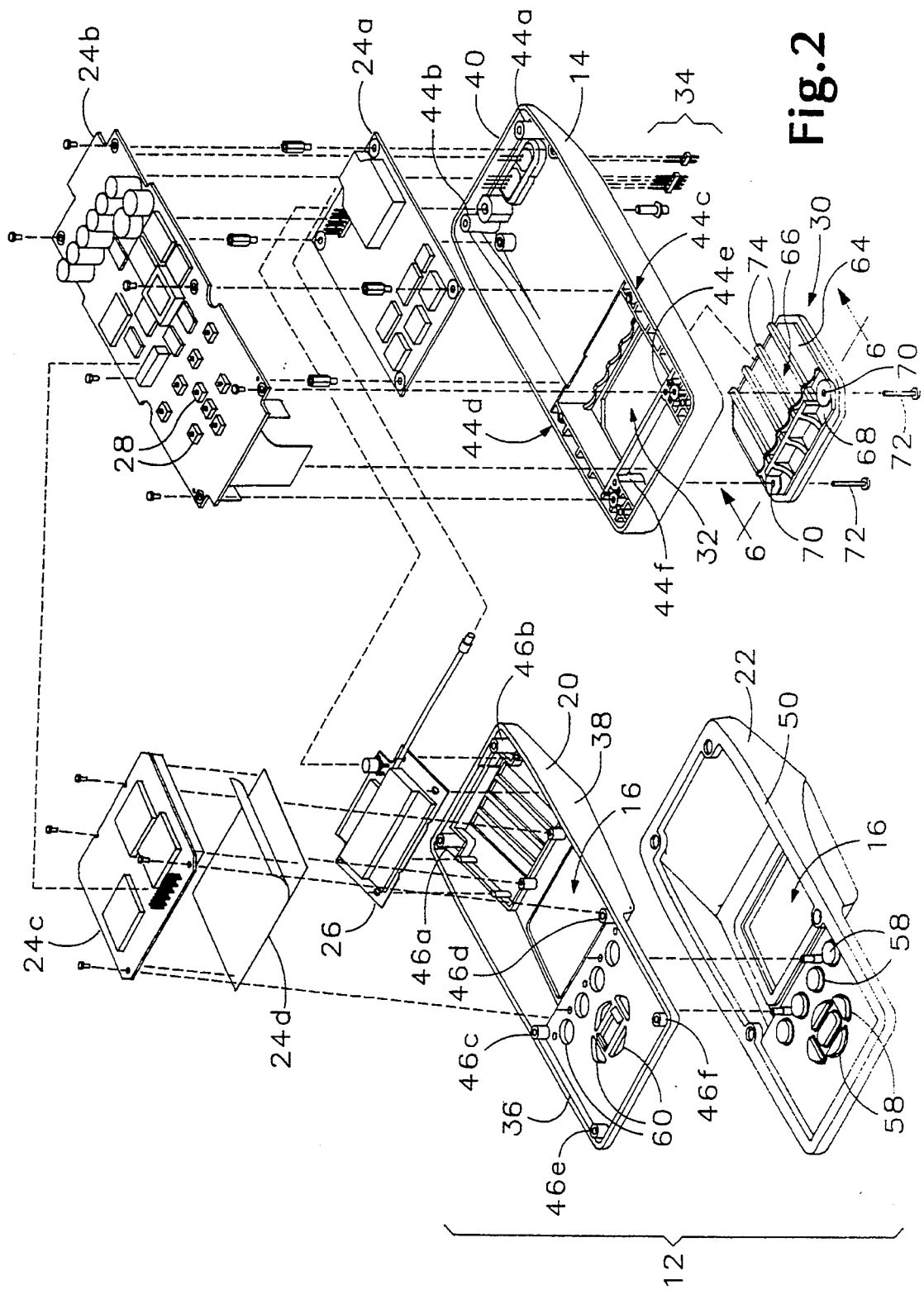

ELECTRONIC DEVICE ENCLOSURE

BACKGROUND OF THE INVENTION

This invention relates to an enclosure for electronic devices, and particularly to enclosures for portable electronic devices which are water-tight, easy to handle and durable.

It is usually desirable to provide for portable electronic devices, particularly those to be used outdoors, an enclosure which minimizes the likelihood that moisture can get inside the enclosure and damage the electronic device. At the same time, since such devices typically operate on batteries, it is desirable to have a means for replacing the batteries which minimizes the likelihood of moisture getting inside the enclosure. In addition, it is desirable to have an enclosure which is easy to handle, even when the user's hands are wet, and which is durable so as to resist dropping, bumping and other impacts. One application for which a water-tight, easy to handle and durable enclosure would be particularly desirable would be to enclose a portable radio receiver for a global positioning system (a "GPS radio receiver").

One problem in the design of an enclosure for a portable electronic device is that such devices typically require inputs supplied by knobs or buttons which select device functions or provide information to the device, and outputs, such as a visual display or the like, which produce information readable by the user. Providing such inputs and outputs while keeping moisture out of the enclosure, and providing a means for replacing batteries in the enclosure while keeping moisture out of the enclosure, present challenges. One challenge is to provide a means for opening the enclosure which provides an adequate moisture seal when the enclosure is closed. Another challenge is to provide a battery access door which may be routinely opened and closed, yet provides an adequate moisture seal. A further problem is to provide mechanical means for inputting data or instructions to the electronic device while providing an adequate moisture seal. A further problem is to provide an enclosure that resists cracking or breaking, which could allow moisture in the enclosure.

One approach to providing a water resistant enclosure for an electronic device is shown by Goldenberg et al. U.S. Pat. No. 5,175,873. However, the enclosure described therein employs multiple redundant sealing joints and, therefore, is relatively complex. Gasparaitis et al. U.S. Pat, No. 5,025,921 shows another approach to providing a water resistant enclosure for an electronic device. However, it does not employ an adequate joint structure for an enclosure which may be separated for access to the interior of an electronic device.

Accordingly, there is a need for an improved enclosure for an electronic device which minimizes the likelihood that moisture can get in the enclosure, while maintaining easy operability of the electronic device and durability of the enclosure.

SUMMARY OF THE INVENTION

The present invention solves the aforementioned problems and meets the aforementioned needs by providing an enclosure having a top and a bottom, having respective lower and upper edges which are the same shape, and an elastomeric cover which fits over the top and wraps around the lower edge thereof like a glove so as to seal the joint between the lower edge of the top and the upper edge of the bottom. The bottom is bolted to the top with a portion of the cover disposed therebetween so as to compress that portion of the cover to maintain an effective seal. Preferably the top and the bottom are each made of a relatively rigid polycarbonate plastic material. Preferably, the cover is made of silicone rubber or urethane of a durometer in the range of 40 to 60 so as not only to provide an effective seal but to render the enclosure easy to grasp and resistant to dropping or being struck. Push buttons with associated suspensions are moulded integrally into the cover so as to protrude downwardly through apertures in the top and engage push button switches on the electronic device therein, thereby providing a complete seal around the push buttons. A display aperture may be provided in the top and, if so, a portion of the cover also wraps around the edges of the display aperture so as to be disposed between the display and the cover, and thereby provide an effective seal.

A battery access door is provided which comprises a central, relatively ridged material surrounded by an elastomeric material which seals the joint between the battery access door and an aperture in the enclosure, preferably in the bottom thereof, and which also provides a holder for the batteries.

Accordingly, it is a principal object of the present invention to provide a novel and improved electronic device enclosure.

It is another object of the present invention to provide an electronic device enclosure which effectively seals separable parts of the enclosure so as to keep moisture out of the enclosure.

It is a further object of the present invention to provide an electronic device enclosure which permits mechanical actuation of controls from outside without defeating the moisture seal.

It is yet another object of the present invention to provide an electronic device enclosure which accommodates a visual display in the electronic device while maintaining an effective seal.

It is yet a further object of the present invention to provide an electronic device enclosure which has a battery access door which can be periodically opened, yet provides an effective water-tight seal when closed.

It is yet another object of the present invention to provide an electronic device enclosure which is easy to grasp and handle, even when the user's hands are wet.

It is yet a further object of the present invention to provide an electronic device enclosure which is durable and resistant to impact.

The foregoing and other objects, features and advantages of the invention will be more readily understood upon consideration of the following detailed description of the invention, taken in conjunction with the accompanying drawings.

BRIEF DESCRIPTION OF THE DRAWINGS

FIG. 1 is a perspective view of an electronic device enclosure according to the present invention, housing an exemplary GPS radio receiver.

FIG. 2 is an exploded view of the electronic device enclosure of FIG. 1, showing the exemplary GPS receiver therein.

FIG. 3 is a side section of the electronic device enclosure of FIG. 1, taken along line 3—3, with a battery access door removed.

FIG. 4 is a section of a portion of the electronic device enclosure of in FIG. 1, taken along line 4—4.

DESCRIPTION OF THE PREFERRED EMBODIMENT

Figure 5:
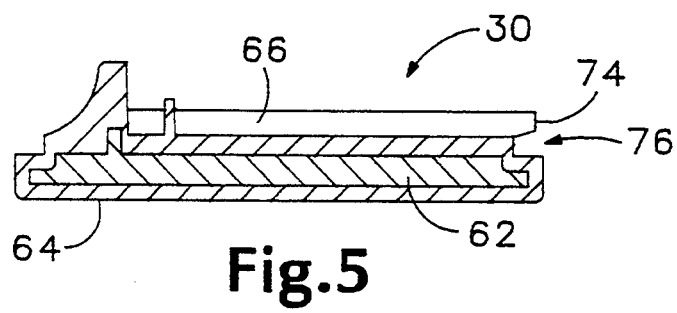
FIG. 5 is a section of a battery access door according to the present invention taken along line 3—3 of FIG. 1.

Referring to FIG. 1, a preferred embodiment of an electronic device enclosure 10 according to the present invention comprises an upper portion 12 and a lower portion or bottom 14. In the exemplary application of the enclosure to a GPS radio receiver, the enclosure also includes an opening 16 in the upper portion 12 for a visual display and a plurality of push buttons 18.

Turning to FIG. 2, as well as FIG. 1, which shows an exploded view of the electronic device enclosure according to the present invention together with an exemplary electronic device, the upper portion 12 actually comprises a top 20 and a cover or "glove" 22 which fits over the top 20. The exemplary electronic device 24a, 24b, 24c and 24d device 24 has a visual display 26 for mounting behind the display opening 16 and a plurality of push button switches 28 mounted on, for example, a printed circuit board and aligned below the push buttons 18 on the top portion 12. While the exemplary electronic device described herein is a GPS radio receiver having a particular set and arrangement of components, it is to be recognized that many other types of electronic devices and many other sets and arrangements of components for a GPS receiver could be used with the enclosure of the present invention without departing from the principals of the invention.

Further, an electronic device enclosure according to the present invention typically also has a battery access door 30. Preferably, the battery access door 30, and a corresponding battery chamber 32, are disposed in the bottom 14 of the enclosure so as to be accessible from the underside of the enclosure. However, it is to be recognized that different sizes, shapes and locations of the battery access door and battery chamber could be employed without departing from the principles of the invention.

Electrical connectors 34 may be mounted on the enclosure, preferably on the bottom 14 thereof, for guiding electrical signals in and out of the enclosure. The electrical connectors are hermetically sealed so as to keep moisture out of the enclosure, as is commonly understood in the art.

The top 20 has a lower edge 36 and an outer surface 38, and the bottom 14 has an upper edge 40. The lower edge 36 of the top 20 is substantially the same shape as the upper edge 40 of the bottom 14. Preferably, the top 20 is attached to the bottom 14, by threaded fasteners 42 such as bolts, as shown in FIG. 4, which fit into posts 44a, 44b, 44c, 44d, 44e and 44f in the bottom 14 and thread into posts 46a, 46b, 46c, 46d, 46e and 46f, respectively in the top 20. Preferably, posts 46 include threaded receptacles 48 therein for receiving the threaded fasteners 42 and thereby providing a strong connection between the top 20 and the bottom 14.

To obtain an effective water tight seal, the cover or glove 22 is made of an elastomeric material, such as silicone rubber or urethane, which fits snugly over the top 20 and includes a gasket portion 50 which wraps under and around the lower edge 36 of the top 20, between the lower edge 36 and the upper edge 40 of the bottom 14. Thence, when the bottom 14 is bolted to and tightened snugly against the top 20, gasket portion 50 of the cover disposed between the lower edge 36 and the upper edge 40 compresses and maintains an effective seal. Preferably, the posts 46 of the top 20 extend beyond the lower edge 36 of the top 20 so as to abut against the posts 44a, 44b, 44c, 44d, 44e and 44f, respectively, of the bottom 14 and thereby prevent unduly compressing the gasket portion 50 of the elastomeric material. Similarly, a portion 52 the elastomeric material of the cover or glove 22 wraps around the edge 54 of the display opening 16 so that, when the display 26 is attached to the top 20, the portion 52 will be disposed between the top and the display, and will be compressed so as to maintain an effective seal.

To ensure that the push buttons 18 do not provide an entry for moisture, they are integrally moulded into the cover 22, the push buttons having downwardly extending protrusions 56 and moulded suspensions 58 around the push buttons to allow them to be moved relative to the rest of the cover. The downward protrusions fit through corresponding apertures 60 in the top 20 and abut against the push button switches 28 of the electronic device to actuate the push button switches. Thence, the push buttons which actuate the electronic device are entirely sealed.

Figure 6:
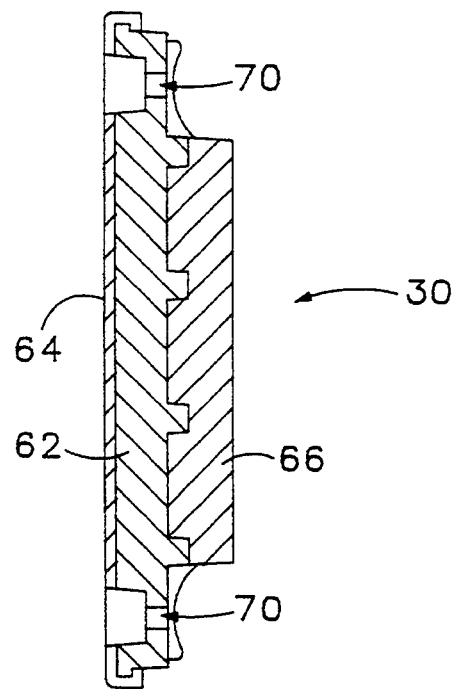
FIG. 6 is a transverse section of the battery access door of FIG. 5 taken along line 6—6 of FIG. 2.

Referring now to FIGS. 5 and 6, as well as FIGS. 2 and 3, the battery access door 30 comprises a substantially rigid central portion 62, surrounded by a shaped elastomeric battery holder and seal 64. Preferably, the battery holder and seal 64 is, like the cover 22, made of urethane or some other equivalent elastomeric material such as, for example, silicone rubber. It includes a shaped portion 66 on top of the access door 30 for receiving and holding batteries snugly in place. An exposed portion 68 of the central portion 62 includes apertures 70 for receiving threaded fasteners 72 to attach the access door 30 to the bottom 14 of the enclosure. Lips 74 on the opposite side of the access door 30 provide gaps 76 for attachment of that side of the access door to the bottom 14.

Preferably, the top 20 and bottom 14 are made of polycarbonate plastic, and the cover 22 is made of silicone rubber having a durometer in the range of 40 to 60. An elastomeric cover having that durometer has been found to be particularly easy to grasp and to provide adequate cushioning for the enclosure, in the event it is dropped or struck, to prevent damage to the enclosure and electronic device therein, and to prevent leakage of moisture into the enclosure as a result of the impact. However, it is to be recognized that, while these materials have been found to be particularly advantageous, other materials might be found which could be used without departing from the principals of the invention.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An enclosure for an electronic device, comprising:
   a top having an upper portion and a side portion each having an outer surface, said side portion having an inner surface and a lower edge;

a bottom adapted to be attached to said top so as to abut said lower edge; and an elastomeric cover adapted to be placed over said top so as to cover said outer surface of said upper portion and said side portion, and wrap around and cover said lower edge and a portion of said inner surface of said top, and thereby act as a seal between said top and said bottom.

2. The enclosure of claim 1, wherein said cover is made of silicone rubber.

3. The enclosure of claim 1, wherein said cover is made of urethane.

4. The enclosure of claim 1, wherein said cover has a durometer of about 40 to 60.

5. The enclosure of claim 1, wherein said top and said bottom are made of polycarbonate plastic.

6. The enclosure of claim 5, wherein said cover is made of silicone rubber.

7. The enclosure of claim 6, wherein said silicone rubber has a durometer of about 40 to 60.

8. The enclosure of claim 1, wherein said top has apertures disposed therein for receiving push buttons and said cover has push buttons integrally moulded therein and disposed so as to protrude through said apertures.

9. The enclosure of claim 1, wherein said bottom has an aperture therein, said enclosure further comprising a door for closing said aperture in said bottom.

10. The enclosure of claim 9, wherein said door comprises a relatively rigid central portion and an outer elastomeric portion covering a portion of said central portion.

11. The enclosure of claim 10, wherein said outer portion includes a shaped portion for receiving and holding batteries within said enclosure.

12. The enclosure of claim 10, wherein said central portion of said door has an outer surface, a peripheral edge and an inner surface, said elastomeric portion being adapted to cover said outer surface, and wrap around and cover said peripheral edge and a portion of said inner surface, so as to be disposed between said door and said bottom, and thereby act as a seal between said door and said bottom.

13. The enclosure of claim 1, wherein said bottom has a lower portion and a side portion, said side portion having an upper edge substantially the same shape as said lower edge of said top so as to abut said lower edge of said top with said cover disposed therebetween.

14. The enclosure of claim 1, wherein said upper portion of said top has an opening therethrough, said top having an inner surface and an opening edge between said outer surface of said upper portion and said inner surface of said upper portion of said top defining said opening, said cover being adopted to wrap around and cover said opening edge and a portion of said inner surface of said cover.

15. The enclosure of claim 14, further comprising a display adapted to be attached to said top so as to abut said inner surface of said top and thereby close said opening with said cover disposed between said display and said upper portion of said top.

16. The enclosure of claim 1, wherein said top has a plurality of top posts and said bottom has a matching plurality of bottom posts, said posts abutting one another when said top is attached to said bottom such that said lower edge of said top is spaced from said bottom so as to limit the compression of that portion of said cover disposed therebetween.

17. An enclosure for an electronic device, comprising:

a top;

a bottom adapted to abut and be attached to said top, and having an aperture therein;

an elastomeric material adapted to be disposed between said top and said bottom and thereby provide a seal between said top and said bottom; and a door for closing said aperture in said bottom, said door comprising a relatively rigid central portion having an outer surface, a peripheral edge and inner surface, and an elastomeric portion adapted to cover said outer surface, and wrap around and cover said peripheral edge and a portion of said inner surface so as to be disposed between said door and said bottom, and thereby act as a seal between said door and said bottom.

18. The enclosure of claim 17, wherein said central portion has an inner surface, a portion of said elastomeric material covering a portion of said inner surface of said central portion and forming a shaped portion for receiving and holding batteries within said enclosure.

* * * * *